United States Patent
Peschke et al.

(10) Patent No.: US 8,487,608 B2
(45) Date of Patent: Jul. 16, 2013

(54) SYSTEM FOR MEASURING HIGH-FREQUENCY SIGNALS WITH STANDARDIZED POWER-SUPPLY AND DATA INTERFACE

(75) Inventors: Martin Peschke, Munich (DE); Toralf Bratfisch, Putzbrunn (DE); Christian Benisch, Augsburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 281 days.

(21) Appl. No.: 12/996,625
(22) PCT Filed: Apr. 21, 2009
(86) PCT No.: PCT/EP2009/002889
§ 371 (c)(1), (2), (4) Date: Dec. 6, 2010
(87) PCT Pub. No.: WO2009/146765
PCT Pub. Date: Dec. 10, 2009

(65) Prior Publication Data
US 2011/0163735 A1    Jul. 7, 2011

(30) Foreign Application Priority Data

Jun. 6, 2008 (DE) .......................... 10 2008 027 031
Jul. 30, 2008 (DE) .......................... 10 2008 035 374

(51) Int. Cl.
*G01R 23/02* (2006.01)
*G01R 23/00* (2006.01)

(52) U.S. Cl.
USPC ........................................ 324/76.39; 702/75

(58) Field of Classification Search
USPC ........ 324/76.39, 76.11, 76.19, 76.56; 702/75, 702/76
See application file for complete search history.

(56) References Cited

U.S. PATENT DOCUMENTS

| | | | |
|---|---|---|---|
| 5,321,350 A * | 6/1994 | Haas | 324/76.11 |
| 5,905,421 A * | 5/1999 | Oldfield | 333/245 |
| 6,298,309 B1 * | 10/2001 | Benco et al. | 702/77 |
| 6,323,658 B1 * | 11/2001 | Kendig et al. | 324/551 |
| 6,402,565 B1 | 6/2002 | Pooley | |
| 6,614,221 B2 | 9/2003 | Cushing | |
| 6,725,170 B1 | 4/2004 | Hickman | |
| 7,532,492 B2 * | 5/2009 | Dobyns et al. | 363/59 |
| 7,652,485 B2 * | 1/2010 | Kazama | 324/632 |
| 2008/0042666 A1 | 2/2008 | Sullivan | |
| 2008/0159368 A1 | 7/2008 | Mende | |

FOREIGN PATENT DOCUMENTS

| | | |
|---|---|---|
| EP | 1 203 962 A2 | 5/2002 |
| EP | 1 209 472 A2 | 5/2002 |
| EP | 1 569 005 A2 | 8/2005 |
| EP | 1 801 699 A2 | 6/2007 |
| GB | 2 436 216 A | 9/2007 |
| WO | 2009/071156 A1 | 6/2009 |

OTHER PUBLICATIONS

International Search Report mailed Oct. 29, 2009, issued in corresponding International Application No. PCT/EP2009/002889, filed Apr. 21, 2009, 3 pages.

(Continued)

*Primary Examiner* — Hoai-An D Nguyen
(74) *Attorney, Agent, or Firm* — Christensen O'Connor Johnson Kindness PLLC (57) ABSTRACT

In a system for measuring at least one high-frequency signal, comprising at least one broadband probe and at least one measuring apparatus, each broadband probe and each measuring apparatus comprise a high-frequency connection for transmitting a high-frequency signal, and each measuring apparatus, or instead of a measuring apparatus each signal processing unit, comprises power supply connections for supplying power to each of the broadband probes, and comprise data signal connections for transmitting communication data between the measuring apparatus or signal processing unit and the broadband probe head. The power supply and data signal connections of each measuring apparatus, each signal processing unit, and each broadband probe are each identical with respect to the signal assignment and signal specification and are designed in accordance with an interface standard, and in each measuring apparatus, each signal processing unit and either directly in the broadband probe or in an adapter unit electrically connected to the broadband probe head are each guided in an identically standardized jack.

15 Claims, 4 Drawing Sheets

OTHER PUBLICATIONS

"Real-Time Spectrum Analyzer TekConnect® Probe Adapter: RTPA2A," Jun. 15, 2005, Tektronix (on-line Data Sheet), <http://www.2.tek.com/cmswpt/psdetails.1otr?ct=PS&cs=psu&ci=1349&1c=EN> [retrieved on Sep. 29, 2009], 2 pages.

English Translation of International Preliminary Report on Patentability mailed Mar. 17, 2011, in corresponding International Application No. PCR/EP2009/002889, filed Apr. 21, 2009.

* cited by examiner

SYSTEM FOR MEASURING HIGH-FREQUENCY SIGNALS WITH STANDARDIZED POWER-SUPPLY AND DATA INTERFACE

The invention relates to a system for measuring high-frequency signals with a standardised power-supply and data interface between measuring device and broadband probe.

Active broadband probes with detection bandwidths above several gigahertz, as used in modern real-time oscilloscopes, provide a hybrid interface comprising high-frequency signal lines and low-voltage signal lines for the power supply and the control of the broadband probe and for reading statuses of the broadband probe to the measuring device.

The manufacturer of the broadband probe generally provides a proprietary—that is to say, manufacturer-specific and non-standardised—interface, such as disclosed, for example, in U.S. Pat. No. 6,402,565 B1, for connecting the broadband probe to the respective measuring device.

If, for reasons of cost and flexibility, a broadband probe is used not only for a given type of real-time oscilloscope, but for a wide range of real-time oscilloscopes and also for other measuring devices, such as sampling oscilloscopes, spectrum analysers, network analysers or DC voltmeters, the interface on the probe does not generally match the interface on the measuring device.

Added to this is the fact that further measuring devices, control devices, supply-voltage devices and adapter-component groups are required for the calibration of a broadband probe.

Figure 1:
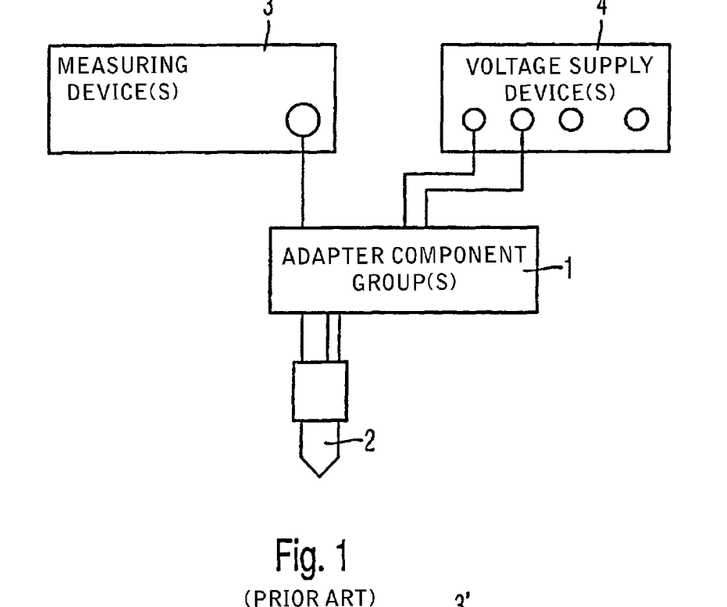
FIG. 1 shows a block-circuit diagram of a system used hitherto for the measurement of high-frequency signals.

FIG. 1 shows an adapter with external power-supply device which was formerly conventional for the applicant. The requirement for a plurality of adapter-component groups 1 and additional measuring devices, control devices and voltage-supply devices 4 for connecting a given broadband probe 2 to different measuring devices 3 and for calibrating the broadband probe 2 according to FIG. 1 increases the overall purchasing cost by a considerable factor by comparison with the purchasing costs for a single broadband probe.

The object of the invention is therefore to provide a cost-favourable technical solution for the use of a broadband probe with different types of measuring device, which at the same time allows a cost-favourable calibration of the broadband probe.

The object of the invention is achieved by a system for measuring a high-frequency signal with the features of claim 1. Meaningful technical developments are indicated in the dependent claims.

According to the invention, a standardised interface is used for the power-supply of the respective active broadband probe and for the data communication between the respective measuring device or the respective signal-processing unit and the respective broadband probe. The power-supply connections and the data-signal connections are designed with identical signal assignment and signal specification in every functional unit used within the measuring system, that is to say, in every measuring device, every signal-processing unit and every broadband probe. Additionally, an identical guiding of the mechanical power-supply connections and data-signal connections within a standardised socket is required in every measuring device and in every signal-processing unit and either in the broadband probe or in an adapter-component group electrically connected to the broadband probe. The adapter-component group is preferably a passive component group without independent power-supply.

Signals of the data communication between measuring device and/or signal-processing unit and broadband probe, for example, the control signals and measured calibration data for the broadband probe and the buffered calibration data, status signals and/or DC measured signals of the broadband probe are guided via the data-signal connections.

If the mechanical power-supply and data-signal connections of the respective broadband probe do not match this standardised interface, a signal conversion is provided, preferably in the adapter-component group for the respective broadband probe, between first mechanical power-supply and data-signal connections, which are electrically connected to the standardised mechanical power-supply and data-signal connections of the respectively used measuring device or of the respectively used signal-processing unit and are also guided in a single, identically standardised socket, and second mechanical power-supply and data-signal connections, which, being electrically connected to the first mechanical power-supply and data-signal connections, are electrically connected to the mechanical power-supply and data-signal connections of the respective broadband probe.

In this manner, any arbitrary broadband probe can be connected to any arbitrary measuring device and any arbitrary signal-processing unit which provides an interface standardised in this manner for the power-supply and data-signal connections. Accordingly, the broadband probe can be used in a universal manner. Moreover, it is advantageous that only a single adapter-component group needs to be provided, which can be connected via the standardised interface for the power-supply and data-signal connections to every measuring device and/or signal-processing unit containing an interface standardised in this manner.

Measuring devices and signal-processing units preferably provide a universal-standardised operating system, so that the measuring device or the signal-processing unit can access the broadband probe like any other peripheral device via an appropriate driver software. In this case, the generation of the drive signals, calibration data and the reading out of status data, calibration data and DC measured signals is designed in a particularly simple manner.

Added to this is the fact that for the calibration of the broadband probe the measuring device or the signal-processing unit receives the direct voltage resulting in the broadband probe and required for the calibration of the broadband probe via the data-signal connections of the standardised interface and supplies the broadband probe with appropriate calibration data via the data-signal connections of the standardised interface. Accordingly, no additional supply-voltage device and/or control device is required for the calibration of the broadband probe, for the supply of the broadband probe and for communication with the broadband probe.

If the high-frequency connections of the measuring devices used do not match the high-frequency connections of the associated broadband probe, in an manner analogous to the signal conversion of the supply voltage and of the data signals, a signal adaptation of the high-frequency signal between first high-frequency connections, which are electrically connected to the respective high-frequency connections of the respective measuring device, and second high-frequency connections, which being electrically connected to the first high-frequency connections, are electrically connected to the associated high-frequency connections of the respective broadband probe.

The standardised interface of the power-supply and data-signal connections preferably corresponds to the Universal-Serial-Bus (USB) standard. The high-frequency connections are typically designed as SMA- or N-high frequency connections in the measuring device and as BNC high-frequency connections in the probe.

The signal-processing unit can be a personal computer, laptop, server or micro-controller board with an integrated Universal-Serial-Bus (USB) interface with display option for generating the supply voltage and control signals and for reading and writing calibration data and registering and displaying status signals and DC measured signals resulting in the broadband probe.

Figure 2A:
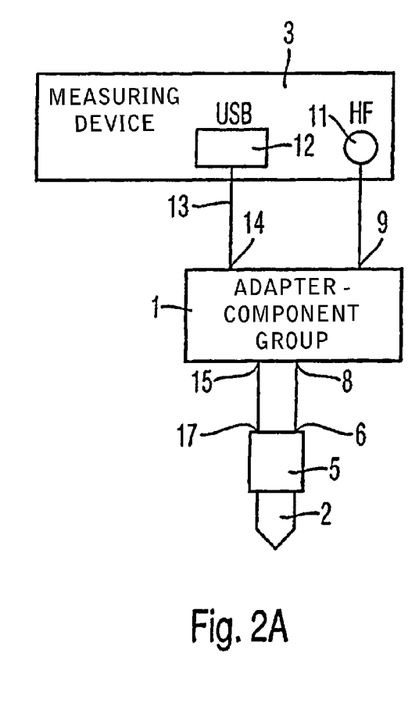
FIG. 2A shows a block-circuit diagram of a first exemplary embodiment of the system according to the invention for measuring high-frequency signals with standardised power-supply and data interface between measuring device and broadband probe.

Preferred embodiments of the system according to the invention for measuring high-frequency signals with standardised power-supply and data-interface between measuring device and broadband probe are explained in detail below with reference to the drawings. The drawings are as follows:

FIG. 2A shows a first embodiment of the system according to the invention for measuring high-frequency signals with standardised power-supply and data interface between measuring device and broadband probe.

An active broadband probe 2 registers a high-frequency signal and transfers it, via a third high-frequency connection 6—typically a BNC jack—which is disposed on a connection box 5 associated with the broadband probe, to a second high-frequency connection 8 attached to the adapter-component group 1, typically a BNC socket, which is connected directly to the third high-frequency connection 6 of the broadband probe 2 (BNC jack 6 of the broadband probe 2 is inserted in the BNC socket 8 of the adapter-component group 1).

In the adapter-component group 1, the electrical conversion and connection of the second high-frequency connection 8 to the first high-frequency connection 9, typically an SMA- or N-jack, which is inserted into a fourth high-frequency connection (HF) 11 of the measuring device 3, typically an SMA- or N-socket, is implemented. Via this connection, the registered high-frequency signal is transmitted to the measuring device 3.

The power-supply and data-signal connections 12 of the measuring device 3 are preferably standardised according to the Universal-Serial-Bus standard (USB standard). Accordingly, they provide in their electrical configuration a power-supply line, an earth line and two data-signal lines for the exchange of serially transmitted communications data and in their mechanical configuration a socket standardised according to the USB standard to receive a USB jack.

The following data are typically transmitted via the data-signal connections:
calibration data
DC measured signal registered by the probe during the calibration
DC offset
amplification and/or attenuation factors
type of broadband probe
input resistance and capacitance of the broadband divider probe
bandwidth and frequency response of the broadband probe
rise time of the broadband probe
selection of DC or AC coupling
measured temperature values 'Via a first electrical connecting line 13, which in each case provides a jack fitting into the mechanical supply-voltage and data-signal connections 12 of the measuring device 3 and a jack fitting into the first supply-voltage and data-signal connections 14 of the adapter-component group 1, preferably a USB jack, the power-supply of the broadband probe 2 and the communications data between measuring device 3 and broadband probe 2 are transmitted via the adapter-component group 1. In the adapter-component group 1, the conversion and connection between first mechanical voltage supply and data-signal connections 14 and second mechanical voltage supply and data-signal connections 15, which match the third mechanical supply voltage and data-signal connections 17 of the broadband probe 2, are implemented. Via this connection, the power-supply of the broadband probe 3 and the communications data are transmitted between adapter-component group 1 and broadband probe 2.

Figure 2B:
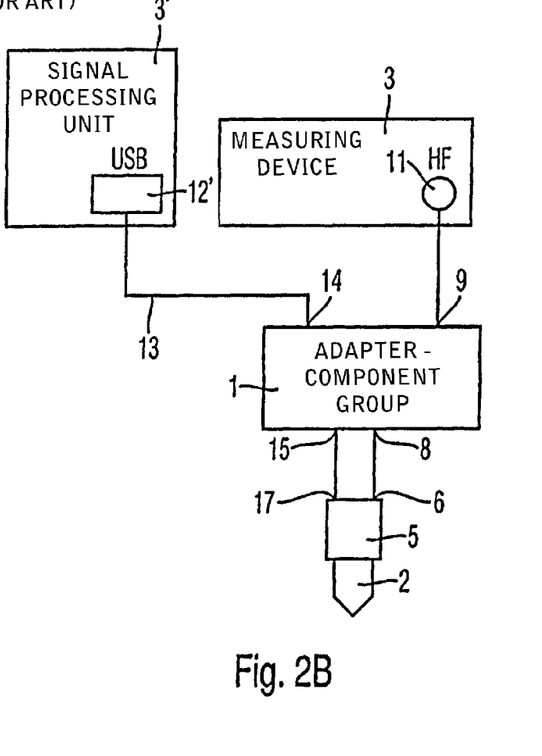
FIG. 2B shows a block-circuit diagram of a second embodiment of the system according to the invention for measuring high-frequency signals with standardised power-supply and data interface between measuring device and broadband probe.

While the power-supply and the communications data for the broadband probe 2 in the first embodiment of the system according to the invention for measuring high-frequency signals with standardised power-supply and data interface between measuring device and broadband probe as shown in FIG. 2A are generated and processed within the measuring device 3 and output via the first supply-voltage and data-signal connections 12, the generation and processing of the communications data and of the power supply in a second embodiment of the system according to the invention for measuring high-frequency signals with standardised power-supply and data interface between measuring device and broadband probe, as shown in FIG. 2B, are implemented in a signal-processing unit 3' and the output of the power-supply and communications data is implemented via associated first power-supply and data-signal connections 12'.

Figure 2C:
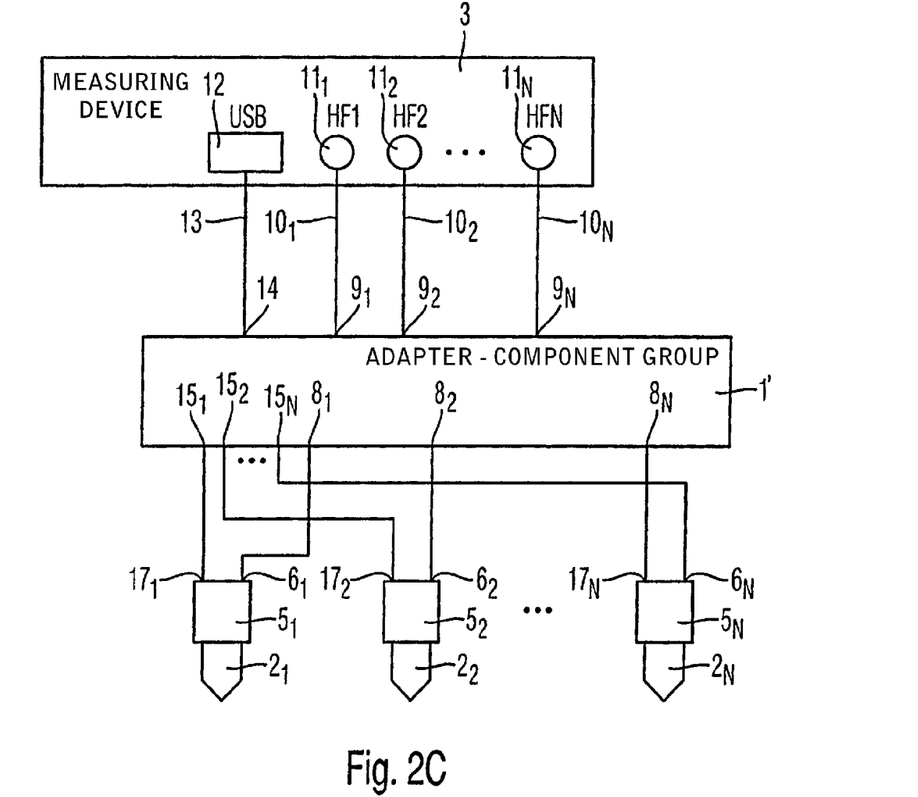
FIG. 2C shows a block-circuit diagram of a third embodiment of the system according to the invention for measuring high-frequency signals with standardised power-supply and data interface between measuring device and broadband probe.

FIG. 2C shows a third embodiment of the system according to the invention for measuring high-frequency signals with standardised power-supply and data interface between measuring devices and broadband probes.

By contrast with the first and second embodiment of the system according to the invention, the measuring device 3 of the third embodiment of the system according to the invention comprises up to N fourth high-frequency connections $11_1$, $11_2$, ..., $11_N$, which are electrically connected in each case via second electrical connecting lines $10_1$, $10_2$, ..., $10_N$ to the up to N first high-frequency connections $9_1$, $9_2$, ..., $9_N$ of the adapter-component group 1'.

Within the adapter-component group 1', the up to N first high-frequency connections $9_1$, $9_2$, ..., $9_N$ are electrically connected respectively to the up to N second high-frequency connections $8_1, 8_2, \ldots, 8_N$, which are once again connected to the N third high-frequency connections $6_1, 6_2, \ldots, 6_N$ of the connection boxes $5_1, 5_2, \ldots, 5_N$ respectively associated with the up to N broadband probes $2_1, 2_2, \ldots, 2_N$.

The power-supply for the individual broadband probes $2_1, 2_2, \ldots, 2_N$ and the communications data between measuring device 3 and the individual broadband probes $2_1, 2_2, \ldots, 2_N$ are electrically transmitted as in the case of the first and second embodiment of the system according to the invention within the measuring device 3 via the power-supply and data-signal connections 12 and the first connecting line 13 to the first power-supply and data-signal connections 14 of the adapter-component group 1'. Within the adapter-component group 1', a connection of the first power-supply and data-signal connections 14 to the up to N second power-supply and data-signal connections $15_1, 15_2, \ldots, 15_N$, which are connected to the power-supply and data-signal connections $17_1, 17_2, \ldots, 17_N$ of the connecting boxes $5_1, 5_2, \ldots, 5_N$ respectively associated with the up to N broadband probes $2_1, 2_2, \ldots, 2_N$ is implemented. Instead of the first power-supply and data-signal connections 14 and the up to N second power-supply and data-signal connections $15_1, 15_2, \ldots, 15_N$ of the adapter-component group 1', a USB hub can also be used as an alternative when using a USB interface standard.

Theoretically, in the third embodiment of the system according to the invention up to 128 broadband probes $2_1, 2_2, \ldots, 2_{128}$ can be connected to the measuring device in this manner as standard, provided a corresponding number of high frequency connections or respectively a correspondingly required signal-processing capacity is available in the measuring device 3.

Figure 2D:
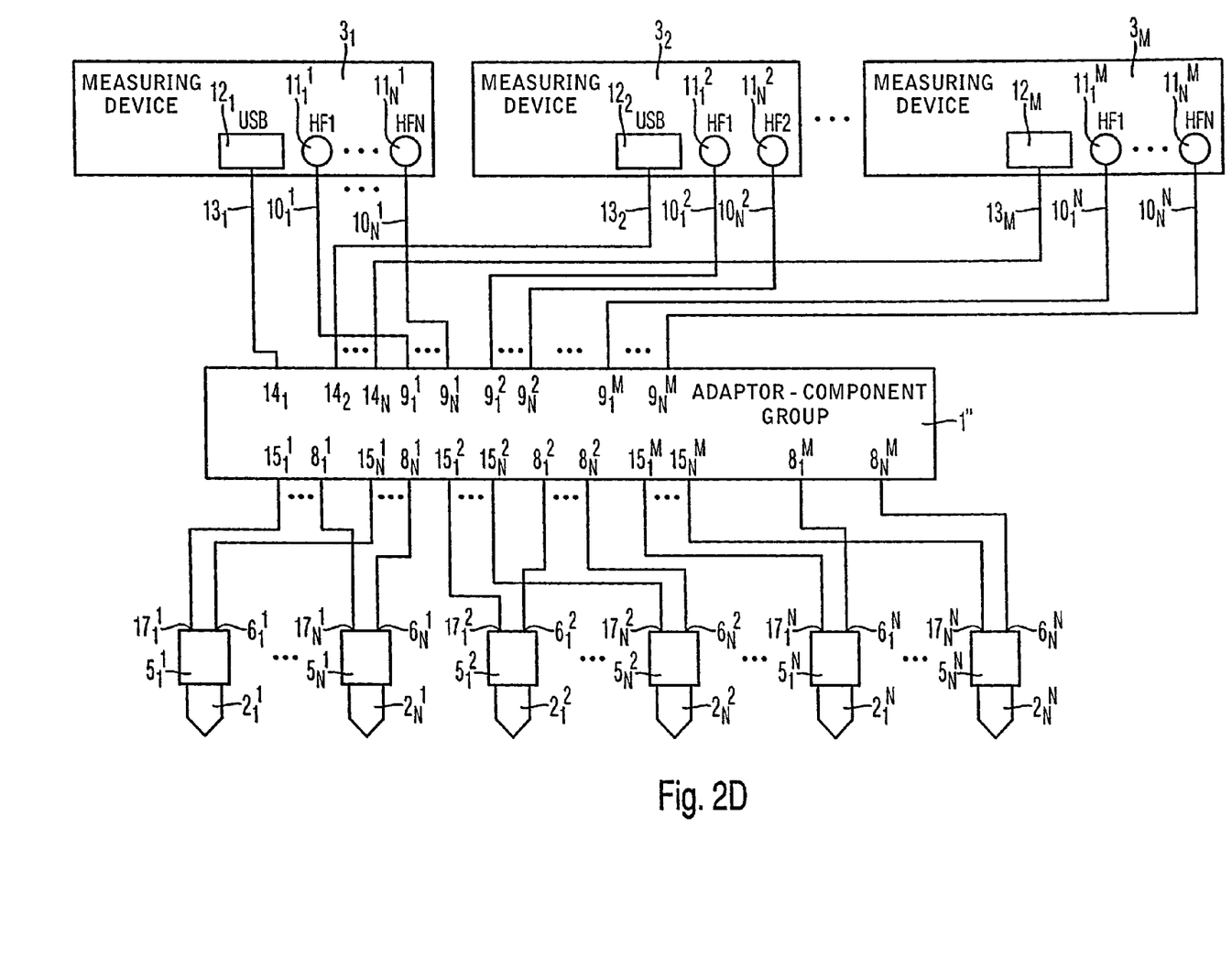
FIG. 2D shows a block-circuit diagram of a fourth exemplary embodiment of the system according to the invention for measuring high-frequency signals with standardised power-supply and data interface between measuring device and broadband probe.

FIG. 2D shows a fourth embodiment of the system according to the invention for measuring high-frequency signals with standardised power-supply and data interface between measuring devices and broadband probes.

By contrast with the first, second and third embodiment of the system according to the invention, several, up to M, measuring devices $3_1, 3_2, \ldots, 3_M$ with respectively up to N high-frequency connections $11_1^1, \ldots, 11_N^1, 11_1^2, \ldots, 11_N^2, 11_1^M, \ldots, 11_N^M$ are provided, which are electrically connected in each case via second electrical connecting lines $10_1^1, \ldots, 10_N^1, 10_1^2, \ldots, 10_N^2, 10_1^M, \ldots, 10_N^M$ to the up to N·M first high-frequency connections $9_1^1, \ldots, 9_N^1, 9_1^2, \ldots, 9_N^2, 9_1^M, \ldots, 9_N^M$.

Within the adapter-component group 1", the up to N·M first high-frequency connections $9_1^1, \ldots, 9_N^1, 9_1^2, \ldots, 9_N^2, 9_1^M, \ldots, 9_N^M$ are electrically connected in each case to the up to N·M second high-frequency connections $8_1^1, \ldots, 8_N^1, 8_1^2, \ldots, 8_N^2, 8_1^M, \ldots, 8_N^M$, which are once again electrically connected to the high frequency connections $6_1^1, \ldots, 6_N^1, 6_1^2, \ldots, 6_N^2, 6_1^M, \ldots, 6_N^M$ of the connecting boxes $5_1^1, \ldots, 5_N^1, 5_1^2, \ldots, 5_N^2, 5_1^M, \ldots, 5_N^M$ respectively associated with the up to N·M broadband probes $2_1^1, \ldots, 2_N^1, 2_1^2, \ldots, 2_N^2, 2_1^M, \ldots, 2_N^M$.

The power-supply for the individual broadband probes $2_1^1, \ldots, 2_N^1, 2_1^2, \ldots, 2_N^2, 2_1^M, \ldots, 2_N^M$ and the communications data between measuring device/s (3) and/or signal-processing unit (3') and the individual broadband probes $2_1^1, \ldots, 2_N^1, 2_1^2, \ldots, 2_N^2, 2_1^M, \ldots, 2_N^M$ are, as in the first second and third embodiment of the system according to the invention, electrically transmitted from the measuring devices $3_1, 3_2, \ldots, 3_M$ or respectively from the in the signal-processing unit 3' via the power-supply and data-signal connections $12_1, 12_2, \ldots, 12_M$ or respectively 12' and the third connecting lines $13_1, 13_2, \ldots, 13_M$ to the first power-supply and data-signal connections $14_1, 14_2, \ldots, 14_M$ of the adapter-component group 1". Within the adapter-component group 1", a connection of the first power-supply and data-signal connections $14_1, 14_2, \ldots, 14_M$ to the up to N·M second power-supply and data-signal connections $15_1^1, \ldots, 15_N^1, 15_1^2, \ldots, 15_N^2, 15_1^M, \ldots, 15_N^M$, which are once again connected to the power-supply and data-signal connections $17_1^1, \ldots, 17_N^1, 17_1^2, \ldots, 17_N^2, 17_1^M, \ldots, 17_N^M$ of the connecting boxes $5_1^1, \ldots, 5_N^1, 5_1^2, \ldots, 5_N^2, 5_1^M, \ldots, 5_N^M$ respectively associated with the up to N·M broadband probes $2_1^1, \ldots, 2_N^1, 2_1^2, \ldots, 2_N^2, 2_1^M, \ldots, 2_N^M$ is implemented.

Instead of the up to M first power-supply and data-signal connections $14_1, 14_2, \ldots, 14_M$ and the up to N·M second power-supply and data-signal connections $15_1^1, \ldots, 15_N^1, 15_1^2, \ldots, 15_N^2, 15_1^M, \ldots, 15_N^M$ of the adapter-component group 1", with the use of a USB interface standard, M USB hubs can also be used as an alternative. Theoretically, in the fourth embodiment of the system according to the invention, up to 128 broadband probes $2_1, 2_2, \ldots, 2_{128}$ can be connected in this manner as standard in each case to a measuring device $3_1, 3_2, \ldots, 3_M$ or a signal-processing unit 3', provided a corresponding number of high-frequency connections or a correspondingly required signal-processing capacity is available in the respective measuring device $3_1, 3_2, \ldots, 3_M$.

Figure 2E:
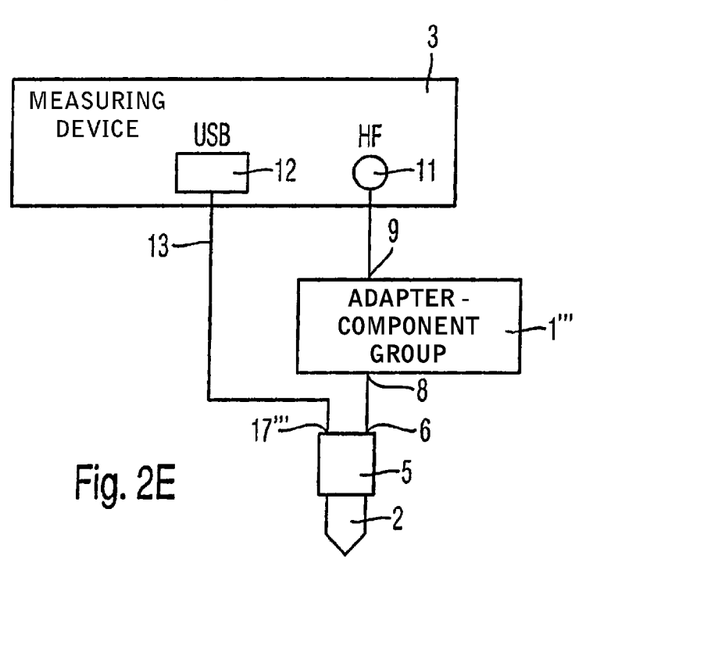
FIG. 2E shows a block-circuit diagram of a fifth exemplary embodiment of the system according to the invention for measuring high-frequency signals with standardised power-supply and data interface between measuring device and broadband probe.

FIG. 2E shows a fifth embodiment of the system according to the invention for measuring high-frequency signals with standardised power-supply and data interface between measuring device and broadband probe.

By contrast with the first, second, third and fourth embodiment of the system according to the invention, the connecting box 5 associated with the broadband probe 3 provides voltage supply and data-signal connections 17''', which with regard to their electrical and mechanical configuration match the electrical and mechanical configuration of the supply-voltage and data-signal connections 12 or respectively 12' of the measuring device 3 or of the signal-processing unit 3' and in particular, like the measuring device 3 or respectively the signal-processing unit 3', provide supply-voltage and data-signal connections according to the USB standard. The first electrical connecting line 13 accordingly extends from the supply voltage and data-signal connections 12 or respectively 12' of the measuring device 3 or of the signal-processing unit 3' up to the supply-voltage and data-signal connections 17''' of the connecting box 5 associated with the broadband probe 3. In the adapter-component group 1''' associated with the fifth embodiment of the system according to the invention, the first and second supply-voltage and data-signal connections 14 and 15 of the adapter-component group 1 and the fourth electrical connecting line 16 between adapter-component group 1 and connecting box 5 of the first embodiment of the system according to the invention are dispensed with.

If, in a combination of the third and fifth embodiment of the system according to the invention, exclusively or in part broadband probes $2_1, 2_2, \ldots, 2_M$ are used, of which the supply-voltage and data-signal connections $17_1, 17_2, \ldots, 17_M$ are identical with regard to their electrical and mechanical configuration to the electrical and mechanical configuration of the supply-voltage and data signal connections 12 of the measuring device 3 and, in particular, like the measuring device 3, provide supply-voltage and data-signal connections according to the USB standard, then the first electrical connecting line 13, which is connected to the supply-voltage and data-signal connections 12 of the measuring device 3, is guided to a data line splitter, for example, a USB hub when using the USB interface. The outputs of the data-line splitter are guided via electrical connecting lines directly to those supply-voltage and data-signal connections $17_1, 17_2, \ldots, 17_M$ of the broadband probes $2_1, 2_2, \ldots, 2_M$, which are identical to the supply-voltage and data-signal connections 12 of the measuring device 3 with regard to their electrical and mechanical configuration, and indirectly via the first and second supply-voltage and data-signal connections 14 and 15$_1$, 15$_2$, ..., 15$_M$ of the adapter-component group 1' to those supply-voltage and data-signal connections 17$_1$, 17$_2$, ..., 17$_M$ of the broadband probes 2$_1$, 2$_2$, ..., 2$_M$, which are not identical with regard to their mechanical configuration to the supply-voltage and data-signal connections 12 of the measuring device 3. All of the interfaces are electrically identical.

By analogy, in a combination of the fourth and fifth embodiment of the system according to the invention, the first electrical connecting lines 13$_1$, 13$_2$, ..., 13$_M$ are guided respectively to a data-line splitter, for example, a USB hub when using the USB interface, if broadband probes 2$_1^1$, ..., 2$_N^1$, 2$_1^2$, ..., 2$_N^2$, 2$_1^M$, ..., 2$_N^M$ are used, which with regard to their electrical and mechanical configuration are designed in an identical manner to the supply-voltage and data-signal connections 12$_1$, 12$_2$, ..., 12$_M$ of the measuring devices 3$_1$, 3$_2$, ..., 3$_M$. The outputs of the data-line splitters are guided in an analogous manner directly via electrical connecting lines to those supply-voltage and data-signal connections 17$_1^1$, ..., 17$_N^1$, 17$_1^2$, ..., 17$_N^2$, 17$_1^M$, ..., 17$_N^M$ of the up to N·M broadband probes 2$_1^1$, ..., 2$_N^1$, 2$_1^2$, ..., 2$_N^2$, 2$_1^M$, ..., 2$_N^M$, which with regard to their electrical and mechanical configuration are identical to the associated supply-voltage and data-signal connections 12$_1$, 12$_2$, ..., 12$_M$ of the measuring devices 3$_1$, 3$_2$, ..., 3$_M$ associated in each case with the respective broadband probe 2$_1^1$, ..., 2$_N^1$, 2$_1^2$, ..., 2$_N^2$, 2$_1^M$, ..., 2$_N^M$, and indirectly via the first and second supply-voltage and data-signal connections 14$_1$, 14$_2$, ..., 14$_M$ and 15$_1^1$, ..., 15$_N^1$, 15$_1^2$, ..., 15$_N^2$, 15$_1^M$, ..., 15$_N^M$ of the adapter-component group 1" to those supply-voltage and data-signal connections 17$_1^1$, ..., 17$_N^1$, 17$_1^2$, ..., 17$_N^2$, 17$_1^M$, ..., 17$_N^M$ of the up to N·M broadband probes 2$_1^1$, ..., 2$_N^1$, 2$_1^2$, ..., 2$_N^2$, 2$_1^M$, ..., 2$_N^M$, which are not identical with regard to their mechanical configuration to the supply-voltage and data-signal connections 12$_1$, 12$_2$, ..., 12$_M$ of the measuring devices 3$_1$, 3$_2$, ..., 3$_M$ associated in each case with the respective broadband probe 2$_1^1$, ..., 2$_N^1$, 2$_1^2$, ..., 2$_N^2$, 2$_1^M$, ..., 2$_N^M$.

Figure 3:
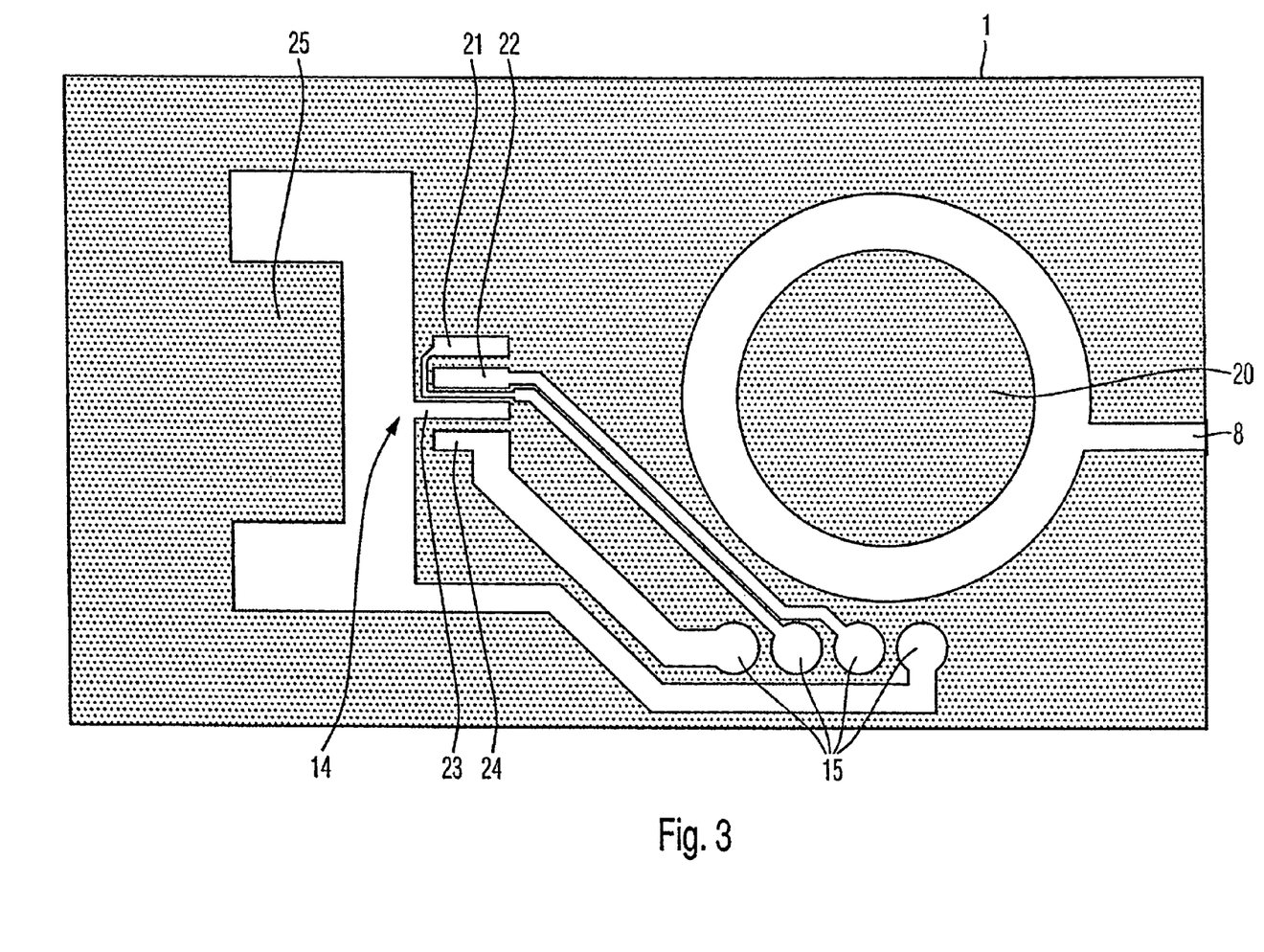
FIG. 3 shows a layout of the adapter-component group of the first embodiment of the system according to the invention for measuring high-frequency signals with standardised power-supply and data interface between measuring device and broadband probe.

FIG. 3 shows an exemplary layout of the adapter-component group 1 associated with the first embodiment of the system according to the invention.

In the right-hand half of the circuit-board layout, a circular cut-out 20 for the second high-frequency connection 8 in the probe can be seen; in the left-hand half of the layout, the connection pads for the supply-voltage and data-signal connections 14 designed as a USB socket can be seen—from top to bottom with the two data-line connections 21 and 22, the earth connection 23 and the supply voltage connection 24—and at bottom right in the layout, the second supply-voltage and data-signal connections 15 electrically connected to the first supply-voltage and data-signal connections 14, which are connected in each case to one of the data-line connections 21 or 22 or to the earth connection 23 or to the supply connection 24. The earth connection 23 is designed in a U-shape to receive the shielding of the USB socket. The circular cut-out 20 is introduced into the circuit board 26 coated with the printed conductors or conductor surface in a subsequent manufacturing step. An earthing surface formed over the entire surface area is preferably disposed on the rear side. The printed circuit board 26 is fitted into the adapter-component group 9 vertically relative to the first and second high-frequency connections 8 and 9.

Instead of or in addition to a measuring device 3 or respectively 3$_1$, 3$_2$, ..., 3$_M$, by analogy with the second embodiment in FIG. 2B, a signal-processing unit 3 or respectively 3$_1$, 3$_2$, ..., 3$_M$, for example, a personal computer, a laptop, a server and/or a microcontroller board or other process computer, which provides supply-voltage and data-signal connections, especially according to the USB standard, a signal-processing unit for digital signal-processing of the detected DC measured signals, for control, for implementation of a calibration of the broadband probes and for the voltage supply of the active broadband probes and a display unit for displaying the detected DC measured signals and status information of the broadband probes used, can be used as an alternative in all other embodiments of the system according to the invention For a successful power-supply of the individual active broadband probes and a successful data communication between the individual broadband probes and the individual measuring devices or respectively signal-processing units, when switching on the measuring device/s and the signal-processing unit/s, a driver software associated with the respective broadband probe should be loaded in the booting up phase of the respective device in order to guarantee an error-free cooperation between the test hardware and application software—in this case test-signal-processing.

The invention is not restricted to the embodiments of the system according to the invention presented. Alongside the currently established Universal-Serial-Bus interface, data-transmission interfaces coming into use in the future which are standardised and represent a standard within the field of industry and telecommunications are also especially covered by the invention.

The invention claimed is:

1. A system for measuring at least one high-frequency signal, wherein said system comprising:
   at least one active broadband probe; and
   at least one device selected from the group consisting of a measuring device and a signal processing unit,
   wherein each active broadband probe and each said device provides for the transmission of a respective high-frequency signal via high-frequency connections, and each said device and each active broadband probe provides for the transmission of power-supply of each of the active broadband probes via first electrical connecting lines and power-supply connections and for the transmission of communications data between said device and the broadband probe via first electrical connecting lines and data-signal connections,
   and wherein the electrical and mechanical configuration of the power-supply connection and data-signal connection in each said device and either directly in each active broadband-probe or in an adapter component group electrically connected to each active broadband probe are identical and designed according to the Universal-Serial-Bus standard.

2. The system according to claim 1,
   wherein, the adapter-component group is a passive component group without its own power-supply.

3. The system according to claim 1,
   wherein, for said at least one device and at least one active broadband probe having a different mechanical configuration of its power supply or data signal connections, the adapter-component group provides in each case first mechanical power-supply and data-signal connections, which are electrically connected to the mechanical power-supply and data-signal connections of the respective device(s) and are guided within a single, identically standardized socket, and in each case provides second mechanical power-supply and data-signal connections electrically connected to the first mechanical power-supply and data-signal connections, which are electrically connected to the mechanical power-supply and data-signal connections of the respective active broadband probe(s).

4. The system according to claim 3,
wherein the first power-supply and data-signal connections and the power-supply and data-signal connections of each said device and of respective active broadband probe(s) are standardized according to the Universal-Serial-Bus standard (USB standard).

5. The system according to claim 3,
wherein, between said device(s) and respective active broadband probe(s), which provide respectively different high-frequency connections, the adapter-component group in each case provides (a) first high-frequency connection(s) for the electrical connection to the high-frequency connection(s) of the measuring device(s) and in each case second high-frequency connection(s) electrically connected to the first high-frequency connection(s) for the electrical connection to the high-frequency connection(s) of the respective broadband probe(s).

6. The system according to claim 5,
wherein each first high-frequency connection of the adapter-component group electrically connected in each case to the respective high-frequency connection of said device is a high-frequency connection corresponding to the high-frequency connection of said device, especially an SMA- or N- high-frequency connection.

7. The system according to claim 5,
wherein the second high-frequency connection of the adapter-component group electrically connected in each case to the respective high-frequency connection of the active broadband probe is a high-frequency connection corresponding to the high-frequency connection of the active broadband probe, and wherein the high-frequency connection is a BNC-high-frequency connection.

8. The system according to claim 1,
wherein,
the signal-processing unit is a personal computer, laptop, server and/or micro-controller board with an integrated Universal-Serial-Bus (USB) port.

9. A system for measuring one or more high-frequency signals, said system comprising:
a device selected from a group consisting of a measuring device and a signal processing device, wherein the one or more devices include an electrical and mechanical connection;
an active broadband probe configured to register the one or more high frequency signals, wherein one of the active broadband probe and an adaptor component group electrically coupled to the active broadband probe includes an electrical and mechanical connection;
a first electrical communications link coupled between said device and the active broadband probe, wherein the first electrical communication link is configured to transfer the one or more high frequency signals from the active broadband probe to said device;
a second electrical communications link including connecting lines coupled between the electrical and mechanical connection of said device and the electrical and mechanical connection of said one of the active broadband probe and an adaptor component group electrically coupled to the active broadband probe, wherein the second electrical communications link is configured to transfer communications data between the active broadband probe and said device and to transfer supply voltage to the active broadband probe,
wherein the configurations of the electrical and mechanical connections of the said device and said one of the active broadband probe and an adaptor component group electrically coupled to the active broadband probe are identical and designed according to the Universal-Serial-Bus standard.

10. The system of claim 9, further comprising the adaptor-component group, wherein the adaptor-component group is disposed in the signal path of the second electrical communications link.

11. The system of claim 10, wherein the adaptor-component group is disposed in the signal path of the first electrical communications link.

12. The system of claim 10, wherein the adaptor-component group includes the electrical and mechanical connection.

13. The system of claim 12, wherein the adaptor-component group is disposed in the signal path of the first electrical communications link.

14. The system of claim 9, further comprising the adaptor-component group, wherein the adaptor-component group is disposed in the signal path of the first electrical communications link and the active broadband probe includes the electrical and mechanical connection.

15. A system for measuring one or more high-frequency signals, said system comprising:
one or more devices selected from a group consisting of a measuring device and a signal processing device, the one or more devices each having an electrical and mechanical connection;
a plurality of first active broadband probes configured to register one or more high frequency signals;
a plurality of second active broadband probes configured to register one or more high frequency signals;
an adaptor-component group electrically coupled to both the plurality of first active broadband probes and the plurality of second active broadband probes, the adaptor-component group having an electrical and mechanical connection for each device of the one or more devices;
a first electrical communication link coupled between the electrical and mechanical connection of the device and the electrical and mechanical connection of the adaptor-component group, wherein the first electrical communication links are configured to transfer communications data and supply voltage therebetween,
a second set of electrical communication links coupled between the adaptor-component group and each of the plurality of first active broadband probes and the plurality of second active broadband probes, wherein the second set of electrical communication links are configured to transfer the one or more high frequency signals to the adaptor-component group from the plurality of first active broadband probes and the plurality of second active broadband probes,
wherein the configurations of the electrical and mechanical connection of the one or more devices and the adaptor-component group are identical and designed according to the Universal-Serial-Bus standard.

* * * * *